(12) United States Patent
Lyakh

(10) Patent No.: US 10,020,635 B1
(45) Date of Patent: Jul. 10, 2018

(54) SPECTROMETER DEVICE WITH STABILIZED LASER AND RELATED DEVICES AND METHODS

(71) Applicant: UNIVERSITY OF CENTRAL FLORIDA RESEARCH FOUNDATION, INC., Orlando, FL (US)

(72) Inventor: Arkadiy Lyakh, Oviedo, FL (US)

(73) Assignee: UNIVERSITY OF CENTRAL FLORIDA RESEARCH FOUNDATION, INC., Orlando, FL (US)

( * ) Notice: Subject to any disclaimer, the term of this patent is extended or adjusted under 35 U.S.C. 154(b) by 0 days.

(21) Appl. No.: 15/488,620

(22) Filed: Apr. 17, 2017

Related U.S. Application Data

(60) Provisional application No. 62/322,856, filed on Apr. 15, 2016.

(51) Int. Cl.
| | |
|---|---|
| G01J 3/00 | (2006.01) |
| H01S 5/068 | (2006.01) |
| H01S 5/12 | (2006.01) |
| H01S 5/34 | (2006.01) |
| H01S 5/40 | (2006.01) |
| H01S 5/0687 | (2006.01) |
| G01J 3/42 | (2006.01) |
| G01J 3/10 | (2006.01) |

(52) U.S. Cl.
CPC ............ *H01S 5/06821* (2013.01); *G01J 3/10* (2013.01); *G01J 3/42* (2013.01); *H01S 5/0687* (2013.01); *H01S 5/12* (2013.01); *H01S 5/3401* (2013.01); *H01S 5/4025* (2013.01)

(58) Field of Classification Search
CPC .......... H01S 5/068; H01S 5/0687; H01S 5/12; H01S 5/34; H01S 5/40; G01J 3/10; G01J 3/42
See application file for complete search history.

(56) References Cited

U.S. PATENT DOCUMENTS

| | | |
|---|---|---|
| 5,272,711 A | 12/1993 | Mawst et al. |
| 5,323,414 A | 6/1994 | Baird et al. |
| 5,337,328 A | 8/1994 | Lang et al. |

(Continued)

OTHER PUBLICATIONS

Walpole, Semiconductor amplifiers and lasers with tapered gain regions, SpringerLink, Optical and Quantum Electronics, Jun. 1996, vol. 28, Issue 6, pp. 623-645, Lincoln Laboratory, Massachusetts Institute of Technology, Lexington, USA.

(Continued)

*Primary Examiner* — Abdullahi Nur
(74) *Attorney, Agent, or Firm* — Allen, Dyer, Doppelt & Gilchrist, P.A.

(57) ABSTRACT

A spectrometer device may include a first QCL configured to operate in a frequency comb mode with spectrally equidistant modes with stable relative phase, a power supply coupled to the first QCL, and a controller coupled to the power supply. The first QCL may include different active region layers based on a vertical transition. The first QCL may be configured to provide a comb output having a cumulative flat gain profile and reduced dispersion refractive index profile in a broad range of driving conditions. The spectrometer device may include a sample cell configured to receive the comb output.

21 Claims, 6 Drawing Sheets

(56) References Cited

U.S. PATENT DOCUMENTS

| | | |
|---|---|---|
| 5,590,141 A | 12/1996 | Baird et al. |
| 5,675,601 A | 10/1997 | Karakida et al. |
| 5,995,692 A | 11/1999 | Hamakawa et al. |
| 6,075,801 A | 6/2000 | Tamanuki et al. |
| 6,239,901 B1 | 5/2001 | Kaneko |
| 6,459,715 B1 | 10/2002 | Khalfin et al. |
| 6,477,191 B1 | 11/2002 | Okada et al. |
| 6,594,297 B1 | 7/2003 | Hayakawa |
| 6,625,182 B1 | 9/2003 | Kuksenkov et al. |
| 6,873,638 B2 | 3/2005 | Haase et al. |
| 7,248,618 B2 | 7/2007 | Volodin et al. |
| 8,014,430 B2 | 9/2011 | Patel et al. |
| 8,068,524 B1 | 11/2011 | Patel et al. |
| 8,121,164 B1 | 2/2012 | Lyakh et al. |
| 9,077,153 B2 | 7/2015 | Maulini et al. |
| 9,608,408 B2 | 3/2017 | Lyakh et al. |
| 2004/0202218 A1 | 10/2004 | Thornton |
| 2004/0218652 A1 | 11/2004 | Spariosu et al. |
| 2005/0083568 A1 | 4/2005 | Nakae et al. |
| 2007/0223552 A1 | 9/2007 | Muendel et al. |
| 2009/0041061 A1 | 2/2009 | Shkunov et al. |
| 2009/0213890 A1 | 8/2009 | Patel et al. |
| 2011/0305256 A1 | 12/2011 | Chann et al. |
| 2012/0133931 A1* | 5/2012 | Fermann ............... G01J 3/10 356/300 |
| 2013/0010823 A1 | 1/2013 | Maulini et al. |
| 2015/0103857 A1 | 4/2015 | Maulini et al. |
| 2016/0322788 A1 | 11/2016 | Lyakh et al. |

OTHER PUBLICATIONS

Goldberg et al., High-power, near-diffraction-limited large-area traveling-wave semiconductor amplifiers, IEEE Journal of Quantum Electronics, vol. 29 Issue: 6, pp. 2028-2043, Jun. 1993.

Welford et al., Observation of linewidth broadening in (GaAl)As diode lasers due to electron number fluctuations, Applied Physics Letters, vol. 40, Issue 7, 1982, Published online Jun. 1998.

Lee et al., High-average-power Nd:YAG planar waveguide laser that is face pumped by 10 laser diode bars, Optical Society of America (OSA) Publishing, Optics Letters, vol. 27, Issue 7, p. 524-526, 2002.

Chilla et al., Recent advances in optically pumped semiconductor lasers, Article in Proceedings of SPIE—The International Society for Optical Engineering, Feb. 2007.

\* cited by examiner

SPECTROMETER DEVICE WITH STABILIZED LASER AND RELATED DEVICES AND METHODS

RELATED APPLICATION

This application is based upon prior filed Application No. 62/322,856 filed Apr. 15, 2016, the entire subject matter of which is incorporated herein by reference in its entirety.

TECHNICAL FIELD

The present disclosure relates to lasers and, in particular, to quantum cascade laser and related methods.

BACKGROUND

Quantum cascade lasers (QCLs) differ from traditional semiconductor diode lasers in that they do not use a p-n junction for light emission. Multiple active regions are "cascaded" so that each injected electron can emit multiple photons and therefore enhance laser gain. Each active region includes a multi-layered semiconductor material structure. This multi-layered semiconductor material structure is designed to have an electronic band structure that gives the desired emission wavelength, and is manufactured with nanometer-level thickness control.

Most commercially available QCLs are of the "edge-emitting" variety. In these, linear ridges are created by etching vertically through the layered structure, which has been grown on a wafer substrate. These are cleaved so that the active region comprises a rectangular ridge several millimeters in length, which forms a waveguide. The laser radiation is amplified by passing back and forth along the axis of the ridge. Laser emission occurs on the end facets of these ridges.

SUMMARY OF INVENTION

Generally speaking, a spectrometer device may comprise a first QCL configured to operate in a frequency comb mode with a plurality of spectrally equidistant modes with stable relative phase, a power supply coupled to the first QCL, and a controller coupled to the power supply. The first QCL may comprise a plurality of different active region layers based on a vertical transition, and the first QCL may be configured to provide a comb output having a cumulative flat gain profile and reduced dispersion refractive index profile. The spectrometer device may include a sample cell configured to receive the comb output. Advantageously, the spectrometer device may operate in a stable mode under broad operating conditions.

More specifically, the spectrometer device may also include a reference gas cell, and a second distributed feedback (DFB) QCL configured to emit an output into the reference gas cell, and the controller may be configured to stabilize an absolute frequency of the first QCL based upon the output of the second DFB QCL and an absorption spectra of the reference gas cell. The second DFB QCL may be configured to emit the output with a single emission line.

In some embodiments, the spectrometer device may also include a first beam splitter configured to split the output of the second DFB QCL, and a first detector coupled to the controller and configured to receive an output of the first beam splitter. The spectrometer device may further comprise a second beam splitter configured to split the output of the first beam splitter, and a second detector coupled to the controller and configured to receive an output of the second beam splitter. The spectrometer device may include a third beam splitter configured to split the comb output of the first QCL, and a third detector coupled to the controller and configured to receive an output of the third beam splitter.

Additionally, the controller may cooperate with the third detector and is configured to stabilize intermode spacing in the comb output. The spectrometer device may further comprise a fourth beam splitter configured to split the output of the third beam splitter. The fourth beam splitter may be configured to direct the comb output to the second detector, and the controller may cooperate with the second detector and is configured to stabilize the absolute frequency of the first QCL. For example, each the first detector, the second detector, and the third detector may comprise one of a quantum well infrared photodetector (QWIP) and a mercury cadmium telluride (MCT) detector.

Another aspect is directed to a laser device. The laser device may include a first QCL configured to operate in a frequency comb mode with a plurality of spectrally equidistant modes with stable relative phase, a power supply coupled to the first QCL, and a controller coupled to the power supply. The first QCL may comprise a plurality of different active region layers based on a vertical transition, and the first QCL may be configured to provide a comb output having a cumulative flat gain profile and reduced dispersion refractive index profile.

Another aspect is directed to a method for making a laser device. The method may include providing a first QCL configured to operate in a frequency comb mode with a plurality of spectrally equidistant modes with stable relative phase, coupling a power supply to the first QCL, and coupling a controller to the power supply. The first QCL may comprise a plurality of different active region layers based on a vertical transition, and the first QCL may be configured to provide a comb output having a cumulative flat gain profile and reduced dispersion refractive index profile.

DETAILED DESCRIPTION

Figure 1:
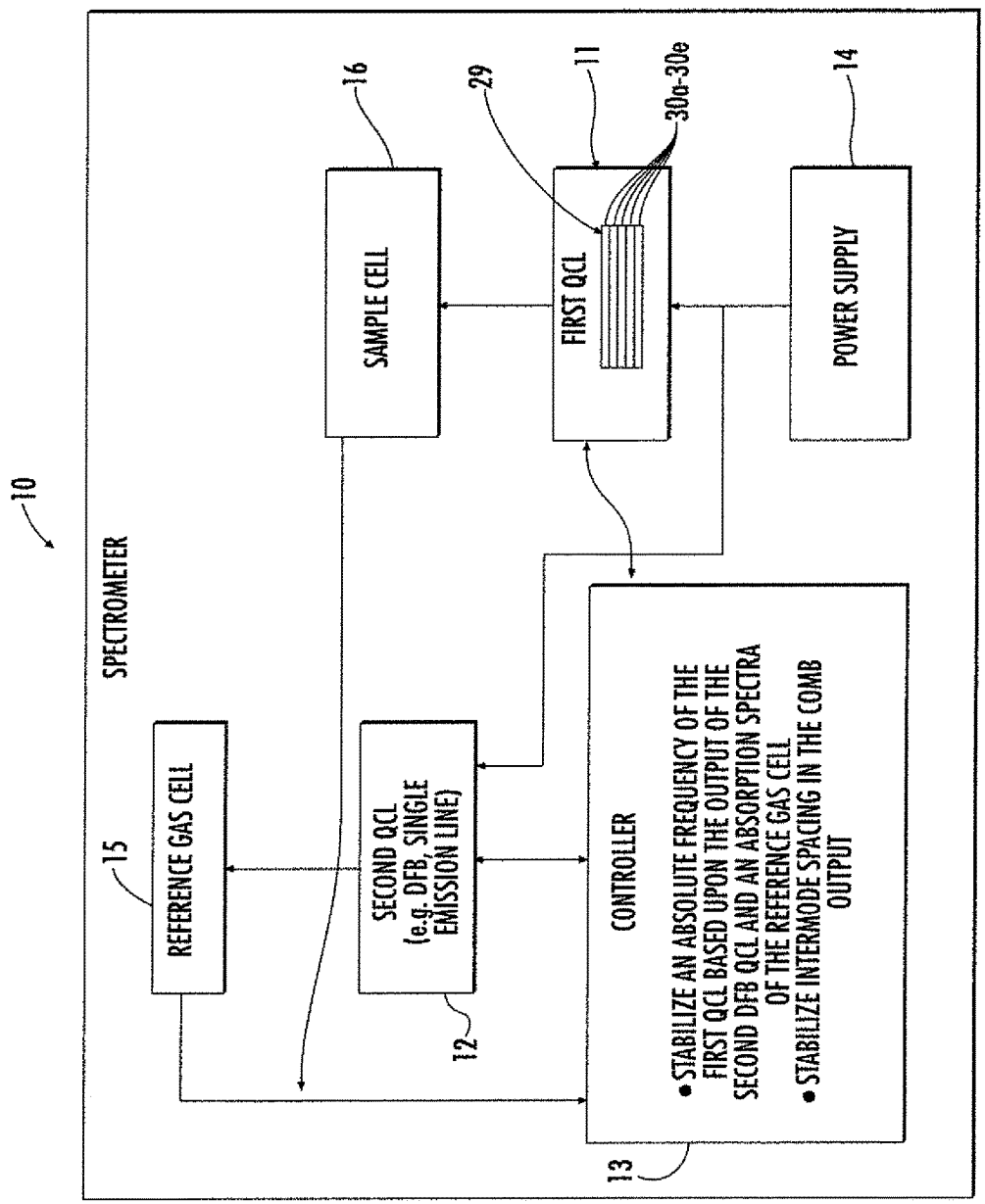
FIG. 1 is a schematic diagram of a spectrometer device, according to the present disclosure.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

In typical spectrometer approaches utilizing a QCL frequency comb source with multiple modes, it is necessary to have fixed spectral spacing and phase relation between the modes. Typically, this condition is satisfied only in a narrow current range for state-of-the-art QCL frequency combs. This current range may not correspond to the highest device power and efficiency, which significantly limits what applications the QCL frequency comb source can be used for.

In the foregoing disclosure, a heterogeneous QCL design for use in a QCL frequency comb spectrometer device is disclosed. The QCL design comprises several active region stage designs in the same waveguide, with each corresponding gain profile being approximately Lorentzian. The cumulative gain (i.e. adding the gain profiles for all stage designs together) for the output is flat and predictable over a wide current range. Indeed, this cumulative gain is available over a greater range of power supply signals than the typical approaches. The QCL achieves this via purely vertical laser transitions in the active region of the QCL. By using the vertical transition, the energy spacing between energy levels stays static even with changes in the current and voltage of the power supply signal.

With that, a discussion regarding some exemplary embodiments now follows. The development of a compact, ruggedized, and frequency stabilized QCL-based frequency comb (FC) platform for spectroscopic industrial applications is proposed. The system will include a laser module comprising a hermetically sealed butterfly package mounted on an air-cooled heat sink and a separate power supply with a temperature and a current comb-stabilization feedback loops. The butterfly package (FIG. 3) will have approximate dimensions of 7"×7"×3" and will include a QCL-based FC source (QCL chip with a heterogeneous active region design), a DFB QCL, a reference gas cell, integrated thermoelectrical coolers (TECs), beam splitters, and either Quantum Well Infrared Photodetector (QWIP) or mercury cadmium telluride (MOT) detectors.

The DFB QCL frequency will be stabilized with temperature and current feedback loops by tuning its emission line to a known absorption line of the reference cell. The stabilized DFB QCL line will be used, in turn, for absolute frequency stabilization of the lowest frequency frequency comb (FC) line. At the same time, the intermode spacing of the QCL comb will be stabilized by tracking either a RF intermode beat note signal with an optical detector or corresponding RF beat note signal in the injection current signal. The design presented in FIG. 3 can be easily extended to a stabilized dual comb source, which is often required for practical spectroscopic applications.

One of the latest and most exciting developments in the QCL field has been the demonstration of QCL-based FCs [1], which opened up a unique opportunity for compact infrared FC sources. Ultra-fast dual-comb spectroscopy can be realized utilizing two QCLs with slightly different intermode spacing [2]. Furthermore, the same QCL structure can, in principle, be designed to operate as a fast detector [3], paving the way to a true monolithic (lab-on-a-chip) dual-comb sensor.

QCL comb structure design is very similar to that of traditional heterogeneous QCLs [4]. For the latter, the design for each stage in the epi-stack has to be optimized to achieve the best tradeoff between threshold current, slope efficiency, and dynamic range. The frequency separation between the stages with different designs is determined by full width at half maximum (FWHM) of the gain curve. The intersubband absorption analysis has to be carried to make sure that the cross-absorption between different stages is suppressed.

The best design techniques developed for high power/ high efficiency broadly tunable QCLs can be extended to the QCL comb structure design, provided that the overall spectral gain/loss profile is structured to result into a wide zero-dispersion spectral region, a condition conducive to mode locking via four-wave mixing (FWM) in the active region. High performance QCL structures may provide multi-watt continuous wave QCL operation throughout the entire MWIR and LWIR spectral regions [4-6]. It was later extended to broadly tunable devices.

QCL combs do not require optical feedback with sensitive alignment characteristic to, for example, external cavity lasers [7]. As a consequence, they can be ruggedized for employment in the most demanding applications.

The availability of well-established technical approaches covering various aspects of the QCL technology, spanning from the active region design to the ruggedized packaging, will allow for a quick transition of the QCL-based FCs from the laboratory environment to practical applications.

Technical Approach

FC generation naturally occurs in mode-locked lasers where formation of multiple coherently linked modes produces ultrashort output optical pulses. The short upper laser lifetime (~1 ps) characteristic to room temperature MWIR and LWIR QCLs makes it impossible to achieve the conventional active phase-locking for QCLs. However, it has recently been demonstrated that passive FC generation is still possible for these devices [1]. The generation of FC in QCL structures is discussed next.

Frequency Comb Generation in QCLs

Material gain spectral width for heterogeneous QCLs is on the order of several hundred wavenumbers. As a consequence, the active medium can support up to one thousand longitudinal optical modes separated by approximately 0.3-0.5 $cm^{-1}$. Since gain saturation favors the multimode operation (lowest threshold condition), numerous longitudinal modes are typically present in the QCL emission spectrum. These modes, however, are generally independent from each other and are not equidistant due to refractive index dispersion. Therefore, they do not form a FC.

The formation of a FC requires presence of a mode locking mechanism in the physical system. It was clearly demonstrated in Reference 8 that a four-wave-mixing (FWM) process mediated via time dependent spatial hole burning can efficiently couple modes in the QCL medium. The FWM process in QCLs is different from most other gain media: the ultra-fast QCL gain recovery ensures that material gain follows the optical field dynamics. This means, in particular, that population inversion can follow beating between modes, which is a phase sensitive process. It was shown in Reference 9 that the beating effect couples two pairs of modes (k,l) and (m,n) that satisfy the condition k−l=m−n. Frequency noise for the QCL FC modes is correlated and, similar to single-mode QCLs, the linewidth for QCL FC combs is determined by the Schawlow-Townes formula [10].

As detailed in Reference 9, the modes in a QCL FC have complex amplitude and relative phase relations: the amplitudes and phases are balanced in such way that instantaneous output power emitted by the laser is approximately constant in time. The reason for the absence of the AM modulation in the optical output is that the saturated gain of the QCL active region broadens short optical pulses propagating through the active region. In other words, it favors constant power output. At the same time, the instantaneous frequency exhibits rapid fluctuation. Therefore, QCL comb sources are a rare example of FM lasers with passive modulation.

Group Refractive Index Dispersion in QCL-Based Frequency Combs

The refractive index dispersion can disturb the mode coupling and prevent FC formation. Therefore, one of the main QCL-comb design goals is to minimize the index dispersion. This task can be effectively tackled using bandgap engineering: QCL gain profile can be engineered using the heterogeneous cascade approach to achieve a nearly zero dispersion at the center of the gain curve.

Figure 4A:
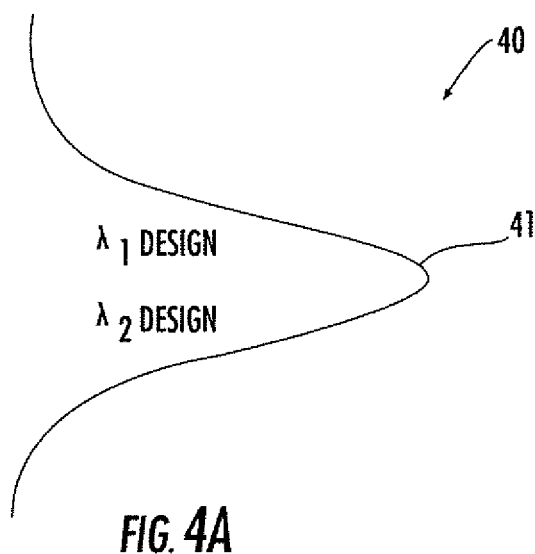
FIGS. 4A and 4B are diagrams, respectively, of a heterogeneous design embodiment and a resultant gain spectral profile QCL comb stabilization embodiment.
Figure 4B:
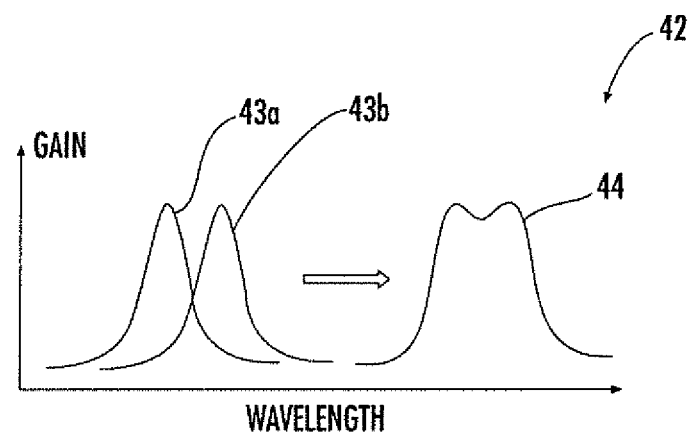

The approach is illustrated in FIGS. 4A-4B and diagrams 40, 42 therein. Two dissimilar active regions, designed for emission at different wavelengths ($\lambda_1$ and $\lambda_2$), are sandwiched in the same waveguide with curve 41 (FIG. 4A). The resultant gain profile 44 is a sum of the two individual gain profiles 43a-43b (FIG. 4B). This approach can be extended to a larger number of different cascades. By carefully choosing a number of active region stages for each design in the heterogeneous stack and their central emission wavelengths, an almost arbitrary spectral gain profile can be engineered. Since gain and refractive index are related through the Kramers-Kronig relations, the control of gain profile allows for the engineering of refractive index dispersion. In particular, it is possible to design a heterogeneous QCL structure with a near zero dispersion in a wide spectral region. This method was used for the original demonstration of frequency combs [1] and it was subsequently used to further improve device performance [11].

QCL Comb Tuning

The intermode spacing in a QCL FC is defined by device cavity length and its typical value is approximately 0.5 cm$^{-1}$. The spacing may be too large for some spectroscopic applications when the FC modes do not coincide with targeted absorption lines. In this case, spectral position of FC lines can be tuned by changing laser temperature: Similar to DFB QCLs, mode position can be changed by approximately 1 cm$^{-1}$ when device temperature changes on the order of 10K. The typically used TEC temperature control is slow, requiring up to one minute stabilization time when a large temperature change is required. An alternative approach for thermal control of spectral lines position is to use so-called micro-heaters, miniaturized heating elements positioned in a close proximity to the laser. Using this approach, the first experiments on dual QCL-comb spectroscopy were performed in Reference 2. However, implementation of micro-heaters requires additional wafer processing steps, which reduces device yield and drives up laser cost. In addition, they have to be independently (electrically) controlled, further increasing complexity and cost of the system.

Wavelength tuning can be also realized via change in injection current as the latter also leads to active region heating. The characteristic heating time in this case is much faster as heat is injected directly into the active region and no extra wafer processing steps or additional electronics are required.

The spectral control of QCL FC by changing injection current is problematic: FC generation has been reported only in a limited current range [1]. The main reason for the mode coupling breakup with current change is that the current change entails a change in the shape of the overall gain profile and corresponding deviation of refractive index profile from its dispersion-less form.

The differential gain shape for a traditional homogeneous design with multiple transitions involved in gain takes the following form (see for example Reference 4):

$$g(\lambda) = \frac{4\pi e}{\varepsilon_0 n \lambda L_p} \eta_i \tau_4 \left(1 - \frac{\tau_3}{\tau_{43}}\right) \sum \frac{\langle z_{4f}\rangle^2 \left(\frac{\gamma_{4f}}{2}\right)}{(E_{4f} - h\nu)^2 + \left(\frac{\gamma_{4f}}{2}\right)^2} \quad (1)$$

where $L_p$ is active region stage length, $z_{4f}$ and $\gamma_{4f}$—matrix element and electroluminescence FWHM of a radiative transition from the upper laser level 4 to a final state f, and $\eta_i$ is injection efficiency. Summation in Formula 1 is done over all transitions contributing to gain.

In the case of a heterogeneous structure (required for FC formation) this formula has to be extended to summation over different stage designs in the heterogeneous stack:

$$\Gamma G(\lambda) = \Sigma_N g_N(\lambda) \cdot \Gamma_N \quad (2)$$

where N is an index running over all active region designs in the epi-stack, $\Gamma_N$ reflects mode overlap factor with the portion of the active region with the given design, and $g_N(\lambda)$ is defined by Formula 1.

The injection efficiency, lifetimes, and matrix elements in Formula 1 generally all depend on applied electric field and, therefore, laser injection current. As a consequence, the gain profile defined by Formula 2 constantly evolves as current changes and the dispersion-less condition is achieved only in a narrow current range.

The bias (current) dependence of the spectral gain shape can be suppressed employing (1) a vertical transition design for each stage in the heterogeneous epi-stack and (2) by concentrating oscillator strength for the level 4 on a single optical transition to the lower laser level 3. The two conditions have to be satisfied in a wide bias range. In this case emission wavelength, matrix elements, and lifetimes will have a weak dependence on applied bias (suppressed Stark effect).

Figure 6:
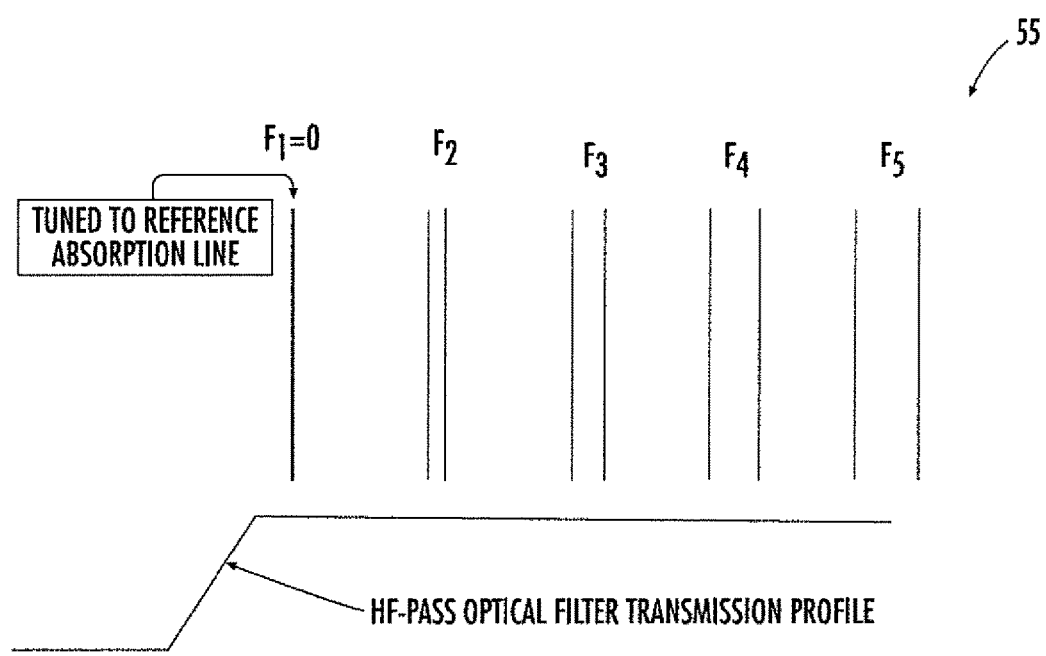
FIG. 6 is a diagram of modes in a dual comb spectroscopic embodiment.

An exemplary design with a suppressed bias dependence is shown in FIG. 6. Both the upper and the lower laser levels are confined in two quantum wells in a wide bias range. As a consequence, emission wavelength has a weak bias dependence. Also, matrix elements and electron lifetimes stay approximately the same throughout a large bias range.

Injection efficiency for the structure in FIG. 6 will also have to be improved to suppress bias dependence of carrier leakage through energy states above the upper lasers level. This can be achieved by increasing energy interval between those parasitic states and the lowest injector state of the previous stage, as well as by reducing spatial overlap between the active region and the injector.

An embodiment of an active region design with a suppressed spectral gain profile dependence on bias will be developed. Using Kramers-Kronig relations, it will be shown that the disclosed design is projected to have a near zero refractive index dispersion in a wide spectral region with suppressed dependence on applied bias (current).

Figure 5:
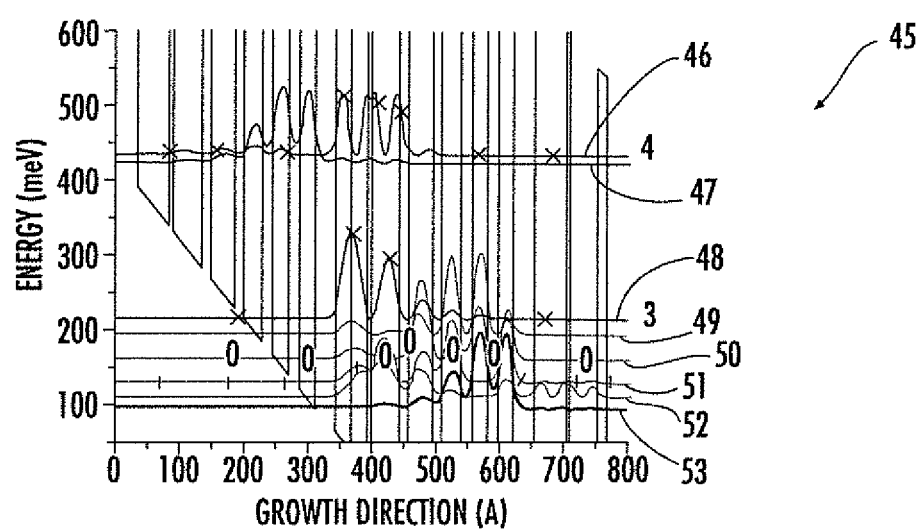
FIG. 5 is a diagram of energy in an exemplary active region embodiment, according to the present disclosure.

Referring now to FIG. 5 and diagram 45 (curves 46-53) therein, a wafer with the disclosed design will be grown and tested. FIG. 5 shows squared wavefunctions anchored at respective energy levels. The upper laser level 4 and the lower laser level 3 are tightly confined in the two active region quantum wells, which leads to a suppressed stark effect. Gain profile measurements will be carried out for short-cavity lasers (several hundred microns) using a Hakki-Paoli approach. If gain shape evolution with bias change is still observed, the design developed will be accordingly modified by controlling "diagonality" of radiative transition for a specific active region design in the epi-stack. Successful implementation of this task will result into QCL FC chips with extended operational FC range, which will simplify integration of these devices into platforms for practical applications.

Comb Stabilization

FC source output has to be stabilized to make the platform useful for a wide variety of high resolution spectroscopic applications. Comb stabilization requires, first, absolute stabilization of one of the lines in the comb and, second, stabilization of the intermode spacing. These are two largely independent tasks and they are separately considered below.

One of the simplest and most reliable approaches for absolute laser line stabilization is to provide a feedback loop tuning the laser emission line to a specific absorption line of a low pressure gas in the reference cell. Since both the frequency comb and gas absorption spectra have multiple emission/absorption lines, it is difficult to analyze their relative positions in a transmission experiment. It is, therefore, proposed here to introduce an additional DFB QCL with a single emission line into the setup: the DFB QCL line will be referenced to a selected absorption line of the gas and the FC, in turn, will be stabilized relative to the DFB QCL line.

The problem of DFB QCL stabilization (and QCL stabilization in general) has been addressed before [12] and those results will be used in this work. In general terms, the problem reduces to stabilization of laser driving conditions (current and temperature) and to a correction for a long term laser wavelength drift caused by gradual changes of laser active region properties.

As discussed in [12], technical requirements for a laser temperature controller are not very stringent: temperature stability better than 0.01K does not lead to an additional line broadening. This condition is typically met for standard temperature controllers. The required stability for the current source, on the other hand, is much more significant as current noise directly translates to emission frequency noise and it has a fast time constant. The maximum tolerable driver noise that does not broaden the emission line was determined to be on the order of 1 nA/√Hz [13]. While this is a very demanding requirement for current stability, such QCL drivers are already offered by some vendors, including Wavelength Electronics.

The elimination of the technical noise (driving electronics) does not eliminate the wavelength drift due to device burn-in [14] as device characteristics typically change during the first 100 hours of operation. In buried heterostructure devices, this wavelength drift is induced by changing resistance of the iron-doped semi-insulating InP layers that provide lateral current and optical confinement. To counteract this effect, instead of adjusting laser current, a slow thermal feedback loop will be implemented in the setup that will help to compensate for the slow and relatively small frequency drift (~2 GHz) by changing DFB QCL temperature.

To summarize the proposed plan for DFB QCL frequency stabilization, a slow thermal feedback loop will be used to compensate for the gradual frequency shift due to device ageing. For this purpose the DFB QCL will be mounted on top of an individual TEC element. A projected temperature adjustment required to keep emission wavelength stable during the device ageing process is within 1K. At the same time, a very fast current feedback loop with current variation in a small range around its set point value will be used to minimize DFB QCL linewidth. By implementing the active stabilization loops controlled with low noise current and temperature controllers, a stable absolute DFB QCL reference with a linewidth significantly below 1 MHz will be achieved (likely in the range of 10 s of KHz; see, for example, References 15 and 16).

The stabilized DFB QCL line will be used as an absolute reference for the QCL FC. Comb stabilization is significantly different from that for the DFB QCL. Namely, comb stabilization requires stabilization of two independent parameters: absolute frequency and intermode spacing. As a consequence, the setup will require two independent controls. The two independent controls that will be used in this work are applied bias (current) and temperature of the laser.

The FC stabilization process will be implemented as follows:

1. An initial set point $(I_0, T_0)$ for the FC chip will be chosen for one of the lowest frequency modes in the comb to coincide with the DFB QCL line by observing a beat note signal between the FC and the DFB laser. The current set point $I_0$ will be chosen close to the middle of the current range in which the chip generates a FC. This will leave us a sufficient leeway in later current set point adjustment, if necessary. Similar to the stabilization of the DFB laser, low noise current and temperature controllers will be used to minimize FC linewidth (<1 MHz).

2. In principle, when all parameters of this physical setup are fixed, the absolute frequency and intermode spacing should not change. However, the device ageing process will gradually change device characteristics, which will entail a drift in both frequency and intermode spacing. We will, therefore, program-in a gradual adjustment to the chosen set point $(I_0, T_0)$ by allowing both current and temperature for the FC chip to independently change in response to the frequency detuning from the reference frequency and the deviation of the measured value of the intermode spacing from its original value. Laser bias will be used for the frequency adjustment in the absolute frequency feedback loop, while temperature control will be used to compensate for the slow change in the intermode spacing measured as an RF beat note signal on a fast optical detector (FIG. 1). To realize this setup, the FC chip will be mounted on an independent TEC.

The proposed packaging approach will come in two options: a single and a dual FC source. In the case of the single FC source, a final user will know that one of the FC modes coincides with a predetermined absorption line of the reference cell and he will also know the intermode spacing.

In the case of the dual comb option, the lowest modes for both FC sources will be tuned to the same absorption line in the reference cell and the user will know that the zero value frequency signal in the RF beat note spectrum corresponds to the reference absorption line in diagram 55 (FIG. 6). The additional information on the intermode spacing for the two FCs will provide an absolute reference for all RF beat note lines. A high-frequency pass optical filter will be used to cut off all the FC modes with frequency below that of the reference frequency to ensure a one-to-one optical to RF signal mapping. If the filter profile is not abrupt enough and several modes with frequency below that for the reference line are transmitted through the filter, several low-frequency RF spectral lines will have to be ignored in the RF spectral analysis. The integrated device package, including all stabilization components.

Referring now to FIG. 1, a spectrometer device 10 according to the present disclosure is now described. The spectrometer device 10 illustratively includes a first QCL 11 configured to operate in a frequency comb mode with a plurality of spectrally equidistant modes with stable relative phase. The spectrometer device 10 illustratively includes a power supply 14 coupled to the first QCL 11, and a controller 13 coupled to the power supply. The first QCL 11 illustratively includes an active region 29 having plurality of different active region layers 30a-30e based on a vertical transition. The first QCL 11 is configured to provide a comb output having a cumulative flat gain profile and reduced dispersion refractive index profile. The spectrometer device 10 illustratively includes a sample cell 16 configured to receive the comb output, and hold unknown material for analysis. As will be appreciated by those skilled in the art, the controller 13 is configured to detect absorption characteristics from the sample cell 16 to identify the unknown material therein.

Also, the spectrometer device 10 illustratively includes a reference gas cell 15, and a second DFB QCL 12 configured to emit an output into the reference gas cell. The controller 13 is configured to stabilize an absolute frequency of the first QCL 11 based upon the output of the second DFB QCL 12 and an absorption spectra of the reference gas cell 12. The second DFB QCL 12 may be configured to emit the output with a single emission line.

Figure 2:
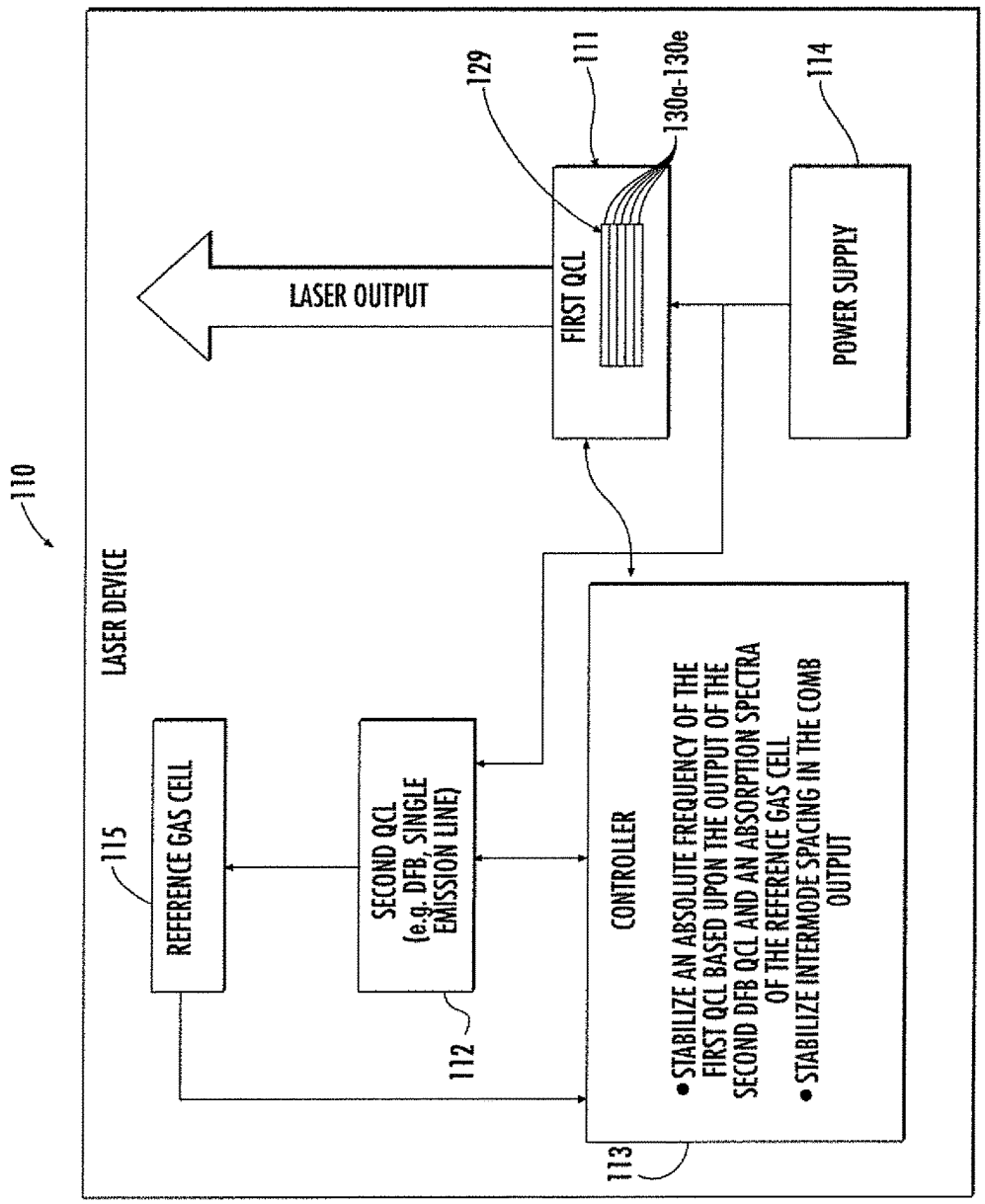
FIG. 2 is a schematic diagram of a laser device, according to the present disclosure.

Referring now additionally to FIG. 2, an embodiment of a laser device 110 is now described. In this embodiment of the laser device 110, those elements already discussed above with respect to the spectrometer device 10 of FIG. 1 are incremented by 100 and most require no further discussion herein. This embodiment differs from the previous devices in that this laser device 110 illustratively omits the sample cell of the spectrometer device 10. In other words, this laser device 110 may be used in other applications than the previously illustrated spectrometer device 10.

Another aspect is directed to a method for making a laser device 110. The method may include providing a first QCL 111 configured to operate in a frequency comb mode with a plurality of spectrally equidistant modes with stable relative phase, coupling a power supply 114 to the first QCL, and coupling a controller 113 to the power supply. The first QCL 111 comprises an active region 129 having a plurality of different active region layers 130a-130e based on a vertical transition, and the first QCL may be configured to provide a comb output having a cumulative flat gain profile and reduced dispersion refractive index profile.

Figure 3:
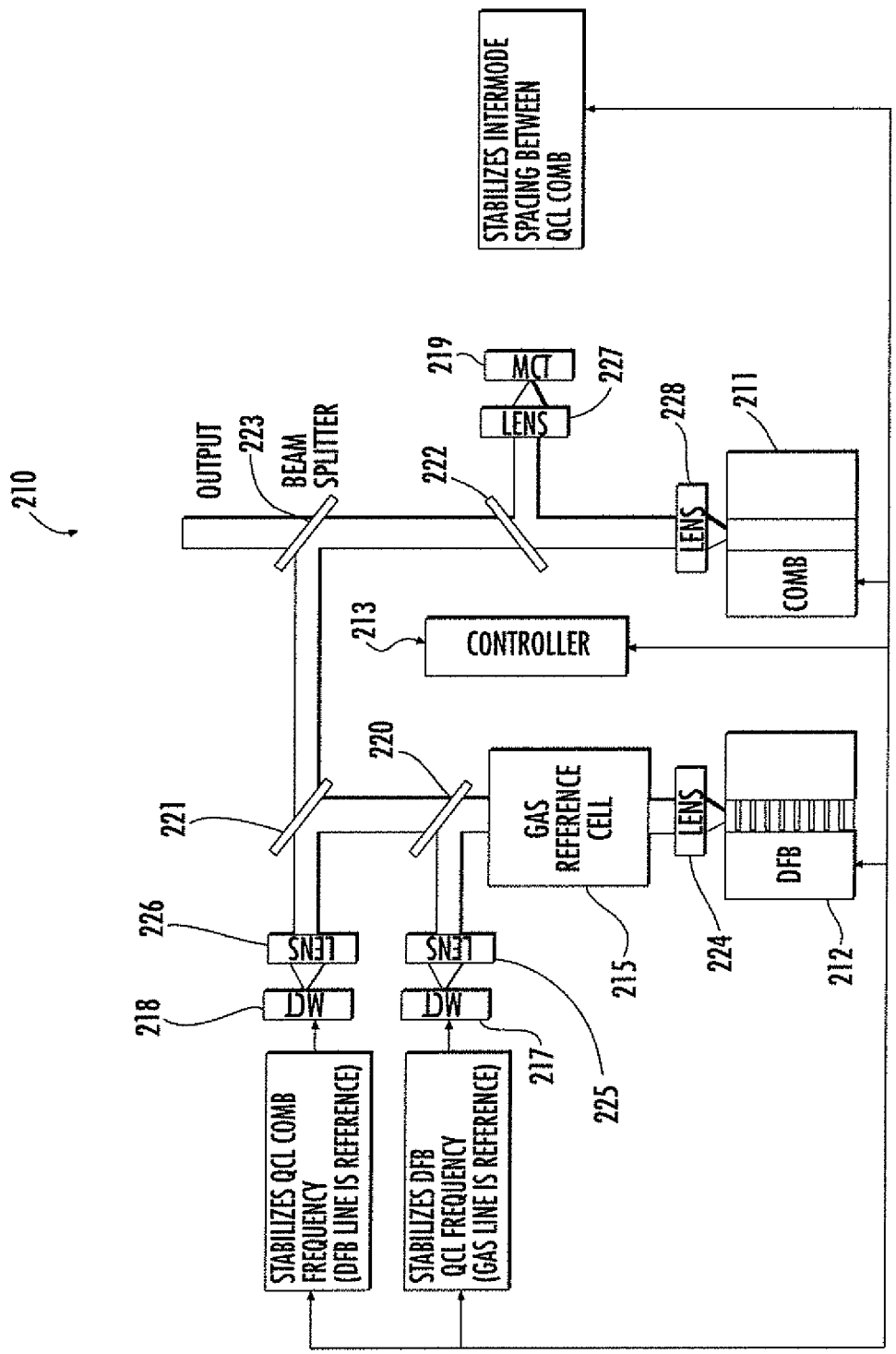
FIG. 3 is a schematic diagram of another embodiment of the laser device, according to the present disclosure.

Referring now additionally to FIG. 3, another embodiment of the laser device 210 is now described. In this embodiment of the laser device 210, those elements already discussed above with respect to FIGS. 1-2 are incremented by 200 and most require no further discussion herein. This embodiment differs from the previous embodiment in that this laser device 210 illustratively includes a first beam splitter 220 configured to split the output of the second DFB QCL 212, and a first detector 217 coupled to the controller 213 and configured to receive an output of the first beam splitter. The laser device 210 illustratively includes a second beam splitter 221 configured to split the output of the first beam splitter 220, and a second detector 218 coupled to the controller 213 and configured to receive an output of the second beam splitter.

The laser device 210 illustratively includes a third beam splitter 222 configured to split the comb output of the first QCL 211, and a third detector 219 coupled to the controller 213 and configured to receive an output of the third beam splitter. Additionally, the controller 213 cooperates with the third detector 219 and is configured to stabilize intermode spacing in the comb output. The laser device 210 illustra-tively includes a fourth beam splitter 223 configured to split the output of the third beam splitter 222. The fourth beam splitter 223 is configured to direct the comb output to the second detector 218, and the controller 213 cooperates with the second detector 218 and is configured to stabilize the absolute frequency of the first QCL 211. For example, each the first detector 217, the second detector 218, and the third detector 219 may comprise one of a quantum well infrared photodetector (QtIP) and a mercury cadmium telluride (MCT) detector.

In this embodiment, the laser device 210 illustratively includes a plurality of lenses (e.g. collimating lenses) 224-227 respectively over the second DFB QCL 212, the first detector 217, the second detector 218, the third detector 219, and the first OCL 211. Also, although this embodiment is a generic laser device 210, it should be appreciated that this structure could be readily applied in a laser spectrometer application, as shown in FIG. 1.

REFERENCES (THE CONTENT OF EACH OF THE BELOW REFERENCES 1-16 IS HEREBY INCORPORATED BY REFERENCE IN ITS ENTIRETY)

1. Hugi, G. Villares, S. Blaser, H. Liu, and J. Faist, "Mid-infrared frequency comb based on a quantum cascade laser", Nature 492, 229 (2012)
2. G. Villares, J. Wolf, D. Kazakov, M. Suess, A. Hugi, M. Beck, and J. Faist, "On-chip dual-comb based on quantum cascade laser frequency combs", Applied Physics Letters 107, 251104 (2015)
3. B. Schwarz, P. Reininger, D. Ristanic, H. Detz, A. Andrews, W. Schrenk, and G. Strasser, "Monolithically integrated dif-infrared lab-on-a-chip using plasmonics and quantum cascade structures", Nature Communications 5, article number 4085 (2014)
4. A. Lyakh, R. Maulini, A. Tsekoun, R. Go, and C. K. N. Patel, "Multiwatt long wavelength quantum cascade lasers based on high strain composition with 70% injection efficiency", Optics Express 22, 24272, October 2012
5. A. Lyakh, R. Maulini, A. Tsekoun, R. Go, and C. K. N. Patel, "Tapered 4.7 µm quantum cascade lasers with highly strained active region composition delivering over 4.5 watts of continuous wave optical power", Optics Express 20, 4382, February 2012
6. A. Lyakh, R. Maulini, A. Tsekoun, R. Go, S. Von Der Porten, C. Pflugl, L. Diehl, F. Capasso, and C. K. N. Patel, "High-performance continuous-wave room temperature 4.0-µm quantum cascade lasers with single-facet optical emission exceeding 2 W", Proceedings of the National Academy of Sciences, vol. 107, p. 18799, November 2010
7. R. Maulini, M. Beck, J. Faist, and E. Gini, "Broadband tuning of external cavity bound-to-continuum quantum cascade lasers", Appl. Phys. Lett. 84, 1659 (2004)
8. P. Friedli, H. Sigg, B. Hinkov, A. Hugi, S. Riedi, M. Beck, and J. Faist, "Four-wave mixing in a quantum cascade amplifier", Applied Physics Letters 102, 222104 (2013)
9. J. Khurgin, Y. Dikmelik, A. Hugi, and J. Faist, "Coherent frequency combs produced by self frequency modulation in quantum cascade lasers", Applied Physics Letters 104, 081118 (2014)
10. F. Cappelli, G. Villares, S. Riedi, and J. Faist, "Intrinsic linewidth of quantum cascade laser frequency combs", Optica 2, 836 (2015)
11. Q. Lu, M. Razeghi, S. Slivken, N. Bandyopadhyay, Y. Bai, W. Zhou, M. Chen, D. Heydari, A. Haddadi, R.

McClintock, M. Amanti, and C. Sirtori, "High power frequency comb based on mid-infrared quantum cascade laser at λ~9 μm", Applied Physics Letters 106, 051105 (2015)
12. S. Schilt, L. Tombez, G. Domenico, D. Hofstetter, "Frequency noise and linewidth of mid-infrared CW quantum cascade lasers", Chapter 12 in "The wonders of nanotechnology: quantum and optoelectronic devices and applications", edited by M. Razeghi, L. Esaki, and K. von Klitzing, ISBN 0819495964, p. 261 (2013)
13. L. Tombez, S. Schilt, J. Francesco, T. Fuhrer, B. Rein, T. Walther, G. Domenico, D. Hofstetter, and P. Thomann, "Linewidth of a quantum cascade laser assessed from its frequency noise spectrum and impact of the current driver", Applied Physics Letters B 109, 407 (2012)
14. S. Schilt, L. Tombez, C. Tardy, A. Bismuto, S. Blaser, R. Maulini, R. Terazzi, M. Rochat, and T. Sudmeyer, "Frequency ageing and noise evolution in a distributed feedback quantum cascade laser measured over a two-month period", IEEE J. of Selected Topics in Quantum Electronics 21, 1200306 (2015)
15. R. Williams, J. Kelly, J. Hartman, S. Sharpe, M. Taubman, J. Hall, F. Capasso, C. Gmachl, D. Sivco, J. Baillargeon, and A. Cho, "Kilohertz linewidth from frequency-stabilized mid-infrared quantum cascade lasers", optics Letters 24, 1844 (1999)
16. F. Cappelli, I. Galli, S. Borri, G. Giusfredi, P. Cancio, D. Mazzotti, A. Montori, N. Akikusa, M. Yamanishi, S. Bartalini, and P. De. Natale, "Subkilohertz linewidth room-temperature mid-infrared quantum cascade laser using a molecular sub-Doppler reference", Optics Letters 37, 4811 (2012)

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. A laser device comprising:
a first quantum cascade laser (QCL) configured to operate in a frequency comb mode with a plurality of spectrally equidistant modes with stable relative phase;
said first QCL comprising a plurality of different active region layers based on a vertical transition;
said first QCL configured to provide a comb output having a cumulative flat gain profile and reduced dispersion refractive index profile.

2. The laser device of claim 1 further comprising a reference gas cell, and a second distributed feedback (DFB) QCL configured to emit an output into said reference gas cell; and further comprising a controller configured to stabilize an absolute frequency of said first QCL based upon the output of said second DFB QCL and an absorption spectra of said reference gas cell.

3. The laser device of claim 2 wherein said second DFB QCL is configured to emit the output with a single emission line.

4. The laser device of claim 2 further comprising:
a first beam splitter configured to split the output of said second DFB QCL; and
a first detector coupled to said controller and configured to receive an output of said first beam splitter.

5. The laser device of claim 4 further comprising:
a second beam splitter configured to split the output of said first beam splitter; and
a second detector coupled to said controller and configured to receive an output of said second beam splitter.

6. A spectrometer device comprising:
a first quantum cascade laser (QCL) configured to operate in a frequency comb mode with a plurality of spectrally equidistant modes with stable relative phase;
a power supply coupled to said first QCL;
a controller coupled to said power supply;
said first QCL comprising a plurality of different active region layers based on a vertical transition;
said first QCL configured to provide a comb output having a cumulative flat gain profile and reduced dispersion refractive index profile; and
a sample cell configured to receive the comb output.

7. The spectrometer device of claim 6 further comprising a reference gas cell, and a second distributed feedback (DFB) QCL configured to emit an output into said reference gas cell; and wherein said controller is configured to stabilize an absolute frequency of said first QCL based upon the output of said second DFB QCL and an absorption spectra of said reference gas cell.

8. The spectrometer device of claim 7 wherein said second DFB QCL is configured to emit the output with a single emission line.

9. The spectrometer device of claim 7 further comprising:
a first beam splitter configured to split the output of said second DFB QCL; and
a first detector coupled to said controller and configured to receive an output of said first beam splitter.

10. The spectrometer device of claim 9 further comprising:
a second beam splitter configured to split the output of said first beam splitter; and
a second detector coupled to said controller and configured to receive an output of said second beam splitter.

11. The spectrometer device of claim 10 further comprising:
a third beam splitter configured to split the comb output of said first QCL; and
a third detector coupled to said controller and configured to receive an output of said third beam splitter.

12. The spectrometer device of claim 11 wherein said controller cooperates with said third detector and is configured to stabilize intermode spacing in the comb output.

13. The spectrometer device of claim 11 further comprising a fourth beam splitter configured to split the output of said third beam splitter; wherein said fourth beam splitter is configured to direct the comb output to said second detector; and wherein said controller cooperates with said second detector and is configured to stabilize the absolute frequency of said first QCL.

14. The spectrometer device of claim 11 wherein each said first detector, said second detector, and said third detector comprises one of a quantum well infrared photodetector (QWIP) and a mercury cadmium telluride (MCT) detector.

15. A laser device comprising:
a first quantum cascade laser (QCL) configured to operate in a frequency comb mode with a plurality of spectrally equidistant modes with stable relative phase;
a power supply coupled to said first QCL; and
a controller coupled to said power supply;
said first QCL comprising a plurality of different active region layers based on a vertical transition;

said first QCL configured to provide a comb output having a cumulative flat gain profile and reduced dispersion refractive index profile.

16. The laser device of claim 15 further comprising a reference gas cell, and a second distributed feedback (DFB) QCL configured to emit an output into said reference gas cell; and wherein said controller is configured to stabilize an absolute frequency of said first QCL based upon the output of said second DFB QCL and an absorption spectra of said reference gas cell.

17. The laser device of claim 16 wherein said second DFB QCL is configured to emit the output with a single emission line.

18. The laser device of claim 16 further comprising:

a first beam splitter configured to split the output of said second DFB QCL; and a first detector coupled to said controller and configured to receive an output of said first beam splitter.

19. A method for making a laser device comprising:

providing a first quantum cascade laser (QCL) configured to operate in a frequency comb mode with a plurality of spectrally equidistant modes with stable relative phase;

coupling a power supply to the first QCL; and coupling a controller to the power supply;

the first QCL comprising a plurality of different active region layers based on a vertical transition;

the first QCL configured to provide a comb output having a cumulative flat gain profile and reduced dispersion refractive index profile.

20. The method of claim 19 further comprising a reference gas cell, and a second distributed feedback (DFB) QCL configured to emit an output into the reference gas cell; and wherein the controller is configured to stabilize an absolute frequency of the first QCL based upon the output of the second DFB QCL and an absorption spectra of the reference gas cell.

21. The method of claim 20 wherein the second DFB QCL is configured to emit the output with a single emission line.

* * * * *